United States Patent [19]
Shepherd et al.

[11] Patent Number: 5,606,228
[45] Date of Patent: Feb. 25, 1997

[54] TELEVISION VERTICAL TIMEBASE CIRCUIT

[75] Inventors: John A. Shepherd, Blagnac; Patrick Douziech, Ornex, both of France

[73] Assignee: Motorola, Inc., Schaumburg, Ill.

[21] Appl. No.: 318,932

[22] Filed: Oct. 6, 1994

[51] Int. Cl.$^6$ .............................. H01J 29/70; H01J 29/76
[52] U.S. Cl. ............................................ 315/408; 315/395
[58] Field of Search ...................... 315/408, 395

[56] References Cited

U.S. PATENT DOCUMENTS 5,359,267  10/1994  Wilber ................................. 315/403
5,442,406  8/1995  Altmanshofer et al. ................ 348/588

*Primary Examiner*—Theodore M. Blum
*Attorney, Agent, or Firm*—Harry A. Wolin; Robert D. Atkins

[57] ABSTRACT

A television vertical timebase circuit includes an arrangement (10, 25, 30, 35, 40, 45) for generating a vertical ramp voltage of first and second slopes corresponding to 4:3 and 16:9 aspect ratios. An arrangement (50,55,65) adds a predetermined voltage to a predetermined portion of the 16:9 ratio ramp voltage such that unwanted visible signals are positioned outside the visible screen area when displaying 16:9 aspect ratio pictures.

10 Claims, 1 Drawing Sheet

TELEVISION VERTICAL TIMEBASE CIRCUIT

FIELD OF THE INVENTION

This invention relates to television vertical timebase circuits.

BACKGROUND OF THE INVENTION

Conventionally, a television set has a screen with a particular aspect (width to height) ratio. This ratio is 4:3 for most televisions.

Some television signals have different aspect ratios, such as a D2-MAC broadcast via satellite, which has an aspect ratio of 16:9. By reducing the picture height by 25% (using only 75% of the entire screen height), a 16:9 aspect signal may be completely reproduced on a 4:3 aspect screen, with a 12.5% void area above and below the picture.

A television set which has the drive and/or cut off levels of its picture tube automatically adjusted, does this by inserting sampling pulses into some lines of the television signal where there is no useful picture information (sampling lines). A cathode current resulting from the sampling lines is measured, and the drive and cut off levels are adjusted such that the cathode current achieves a desired level. When displaying a 4:3 signal on a 4:3 screen, the sampling lines are above the topmost visible part of the screen, hence the lines are out of view.

A problem with this arrangement is that in the case of a 16:9 signal being viewed on a 4:3 screen, such sampling lines appear in the void area, causing disturbance to a person viewing the television screen.

This invention seeks to provide a vertical timebase circuit in which the above mentioned disadvantage has been mitigated.

SUMMARY OF THE INVENTION

It is an object of the present invention to provide a television vertical timebase circuit comprising means for generating a vertical ramp voltage of first and second slopes corresponding to respective first and second picture aspect ratios in which the second aspect ratio has a smaller picture height than the first and means for adding a predetermined voltage to a predetermined portion of the second ramp voltage to adjust the starting position on the screen of pictures of the second aspect ratio, and means for inhibiting adding the predetermined voltage during the occurrence of unwanted visible signals whereby said unwanted visible signals are positioned outside the visible screen area when displaying pictures of the second aspect ratio.

The circuit may further comprise means for inhibiting generation of the ramp voltage of the second slope during the occurrence of the unwanted visible signals.

The generating means may comprise current source means arranged to charge a capacitor. The means for inhibiting generation of the ramp voltage may comprise means for inhibiting charging of the capacitor during the occurrence of the unwanted visible signals.

The current source means may comprise two current sources arranged simultaneously to charge the capacitor to provide one of the two ramp voltages and wherein one current source is arranged to charge the capacitor to provide the other of the two ramp voltages. The first and second picture aspect ratios may be 4:3 and 16:9 respectively.

The predetermined portion of the second ramp voltage may be that portion coinciding with the portion of the television picture which does not contain the unwanted visible signals. The predetermined voltage may be an offset voltage arranged to vertically offset the second television picture such that it is placed centrally on the screen. The unwanted visible signals may be sampling lines added to the television signal. The adding means is a voltage adder circuit.

In this way, the sampling lines added by the television to a 16:9 signal being viewed on a 4:3 screen are arranged to be positioned outside the visible screen area so that they do not cause disturbance to a person viewing the television screen.

BRIEF DESCRIPTION OF THE DRAWINGS

An exemplary embodiment of the invention will now be described with reference to the drawings in which.

DETAILED DESCRIPTION OF A PREFERRED EMBODIMENT

Figure 1:
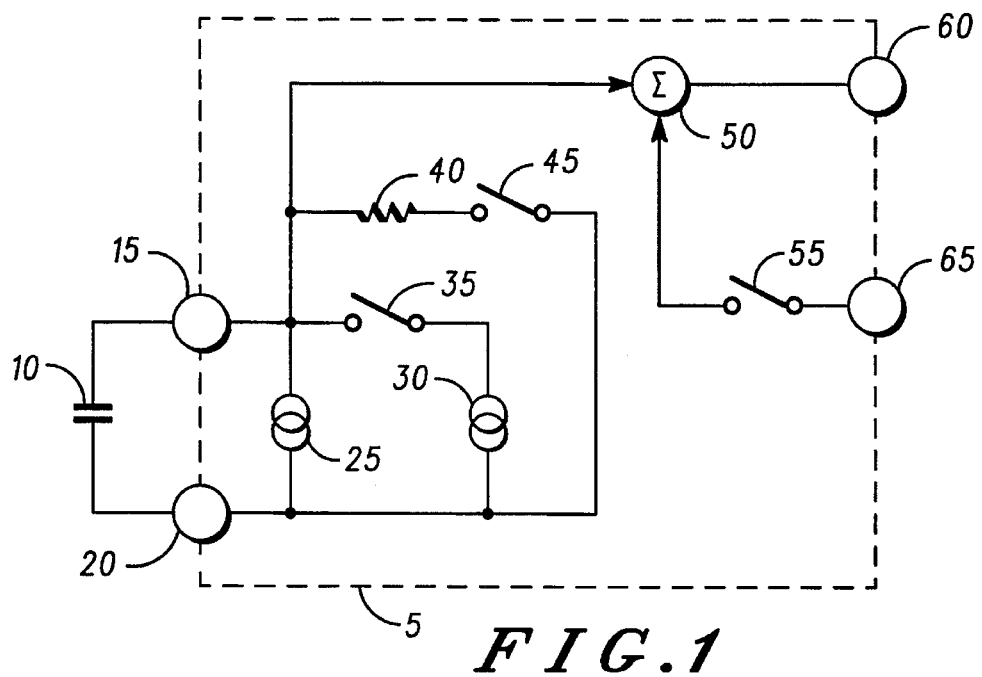
FIG. 1 shows a preferred embodiment of a vertical timebase circuit in accordance with the invention; and, FIG. 2 shows in diagrammatic form, first and second ramp output voltages produced by the preferred embodiment of FIG. 1.

Referring to FIG. 1, there is shown a vertical timebase circuit 5 for use with a television, the television having a screen aspect ratio of 4:3. A terminal 15 of the circuit 5 is coupled to one terminal of an external capacitor 10, the other terminal of which is connected to a ground terminal 20 which also provides a ground connection for the circuit 5.

A first current source 25 is coupled between the ground terminal 20 and the terminal 15, for providing a first current therebetween.

A second current source 30 is coupled between the ground terminal 20 and the terminal 15 via a first switch 35, for providing a second current, which is added to the first current if the first switch 35 is closed. The first switch 35 is controlled by a control circuit of the television (not shown), which is arranged to set the first switch 35 open if a 16:9 aspect ratio is required, and to set it closed if a 4:3 ratio is required.

A resistor 40 is also coupled between the terminal 15 and the ground terminal 20 via a second switch 45, for providing a resistive path therebetween if the second switch 45 is closed. The second switch 45 is controlled by a (well known) line decoder circuit (not shown), coupled to a line counter of the television (not shown). The line decoder circuit is arranged to detect the occurrence of one or more lines of television signal from the line counter, and is set to close the switch 45 during the occurrence of the detected lines.

A voltage adder circuit 50, having first and second inputs and an output, has its first input coupled to the terminal 15, its second input to an input terminal 65 through a third switch 55 and its output to an output terminal 60.

The input terminal 65 is coupled to receive a timing pulse to be described hereafter, which is generated by the line decoder circuit of the television as described above (not shown).

The third switch 55 is also controlled by the control circuit described above (not shown), such that the switch 55 is set open for the 4:3 case and closed for the 16:9 case. The timing pulse is thus added by the voltage adder circuit 50 to the voltage appearing at the terminal 15 for the 16:9 case (when the third switch 55 is closed).

The output terminal 60 is coupled to a vertical deflection circuit of the television (not shown), containing deflection coils which deflect the electron beam vertically.

Figure 2:
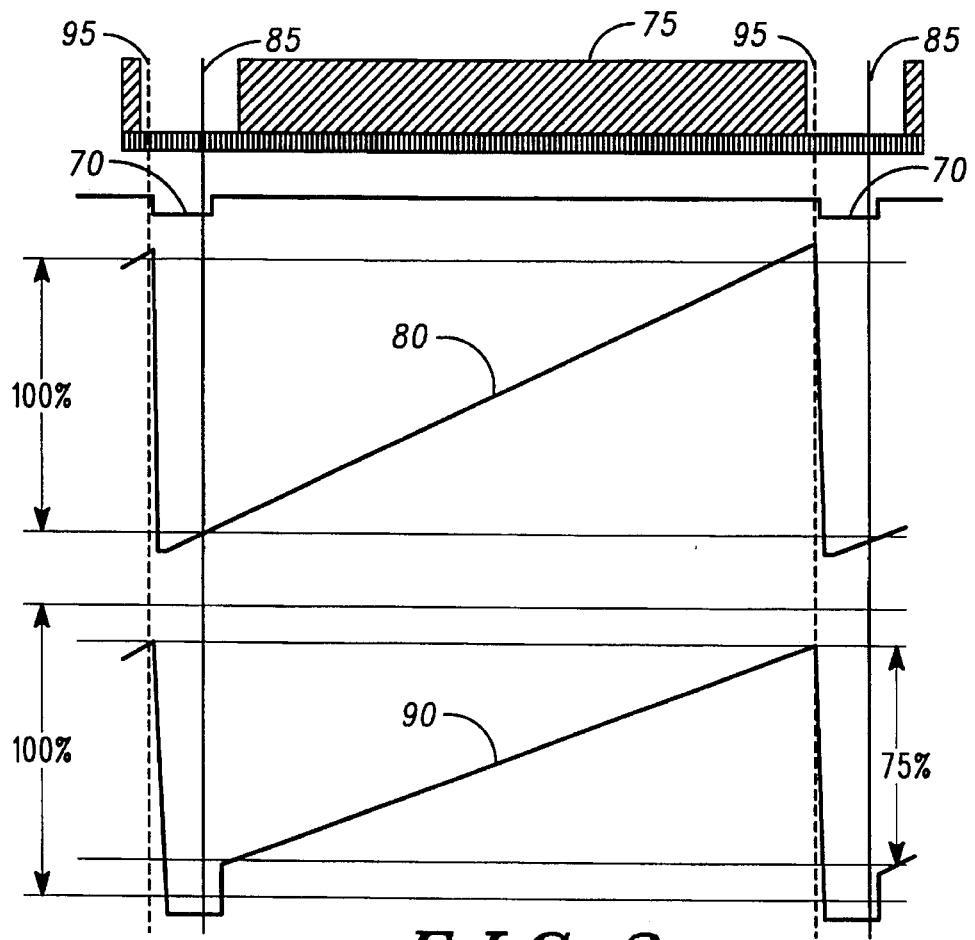

In operation, and with reference also to FIG. 2, a television signal having an aspect ratio of 4:3 is to be produced on the screen of the connected television. The first switch 35 of the circuit 5 is set closed by the control circuit, to connect the second current source to the terminal 15. Similarly the third switch 55 is set open by the control circuit, to disconnect the input terminal 65 from the voltage adder circuit 50.

The current sources 25 and 30 simultaneously charge up the capacitor 10, resulting in a ramp voltage at the output terminal 60 (the ramp 80 of FIG. 2). A synchronisation pulse 95 of the television signal provides timing for the start of each excursion of the ramp 80.

When the synchronisation pulse occurs, the line decoder circuit (not shown) momentarily closes the switch 45 which discharges the ramp capacitor 10 through the resistor 40. The switch 45 is opened, the ramp capacitor 10 begins to charge and the ramp voltage increases.

The ramp voltage produces a varying current in the connected vertical deflection circuit. The value of the ramp capacitor 10 and the current sources 25 and 30 are such that the variation in the ramp voltage is sufficient to enable the deflection coils of the vertical deflection circuit to fill the television screen with the wanted visible signal.

Sampling lines 85 added by the television to the television signal occur just before the ramp voltage is large enough to provide sufficient current to the vertical deflection coils to place the signal in the visible part of the television screen. Therefore the sampling lines 85 of the 4:3 picture do not appear to the viewer because they are produced just above the visible part of the screen.

In a second case, a television signal having an aspect ratio of 16:9 is to be produced on the same 4:3 aspect television screen. In this case, the first switch 35 of the circuit 5 is set open, such that only the first current source 25 is connected to the terminal 15.

The ratio of the current sources is arranged such that the first source 25 produces 75% of the current of the combined arrangement of two sources. In this way a reduced current charges up the ramp capacitor 10. Since the charge stored in a capacitor is proportional to the charging current supplied to it, the ramp 90 resulting from the charging of the capacitor 10 has only 75% of the vertical range of the ramp 80. Therefore the current supplied to the vertical deflection circuit is also only 75% of that required for a full height picture on the television screen.

The third switch 55 is set closed, such that the input terminal 65 is coupled to the voltage adder circuit 50. The timing pulse (70 of FIG. 2) present at the input terminal 65 is decoded from the line counter of the television (not shown) by the line decoder circuit described above (not shown). The timing pulse 70 (zero voltage at the input terminal 65) is arranged to start just after the line 1 of the television signal (the synchronisation pulse 95) and finish after the last of the sampling lines 85 but before the first line of useful picture signal (the block 75). The timing pulse 70 is arranged to be active low, so at all other times there is a fixed voltage level at the input terminal 65.

The voltage adder circuit adds the fixed voltage to the ramp voltage at the output terminal 60, except at the occurrence of the timing pulse 70, when the added voltage value is zero. The fixed voltage increases the ramp voltage by a constant amount. This vertically offsets the ramp 90, resulting in a downward shift of the generated picture. The fixed voltage level is appropriately chosen such that the offset is 12.5% of the full screen height. Hence the 16:9 picture appears in the centre of the screen.

The sampling lines 85 are added to both the 16:9 and 4:3 television signals just after the synchronisation pulse 95. When the synchronisation pulse 95 occurs, the line decoder circuit sets the switch 45 closed to discharge the capacitor 10 and therefore reset the ramp 90. For the 16:9 case the line decoder circuit is set to keep the switch 45 closed until after the sampling lines 85 have occurred. In this way the starting point (in time) of the ramp voltage is adjusted by holding it at zero until the sampling lines have been put on the screen. The timing pulse at the input terminal 65 ensures that the nominal supply voltage which generates the ramp offset is inhibited during this time. If this were not done, the supply voltage added to the ramp voltage would place the sampling lines in the visible screen area.

In this way the ramp 90 is held at zero for the duration of the sampling lines and hence the vertical deflection circuit holds the television signal at the top of the screen when the sampling lines occur.

Therefore the 16:9 picture can be fully viewed on the 4:3 screen, and the sampling lines which are not desired in the visible area of the screen but which must not be blanked are held at the top of the screen, out of the visible area.

It will be appreciated that alternate embodiments to the one described above may be achieved. For example, although the above embodiment uses a combination of the timing pulse to inhibit adding the voltage and delaying the start of the ramp until after the occurrence of the unwanted visible signals, this is not essential and the timing pulse alone could be used to remove the sampling lines from the visible screen area.

A switched capacitor arrangement comprising a first capacitor and a second selectively coupled capacitor, charged by a single current source, could be used to provide the first and second ramp voltages instead of the capacitor 10 and the two current sources 25 and 30.

Furthermore, an alternative to the timing pulse could be used to time and add the predetermined voltage, such as the synchronisation pulse used in conjunction with a delay arrangement.

The circuit could be arranged to work with aspect ratios other than the two mentioned above, and for other types of unwanted lines added at other portions of the television signal.

We claim:

1. A television vertical timebase circuit comprising, means for generating a vertical ramp voltage of first and second slopes corresponding to respective first and second picture aspect ratios in which the second aspect ratio has a smaller picture height than the first, and means for adding a predetermined voltage to a predetermined portion of the second ramp voltage to adjust the starting position on the screen of pictures of the second aspect ratio, and means for inhibiting adding the predetermined voltage during the occurrence of unwanted visible signals whereby said unwanted visible signals are positioned outside the visible screen area when displaying pictures of the second aspect ratio.

2. The television vertical timebase circuit of claim 1 further comprising means for inhibiting generation of the ramp voltage of the second slope during the occurrence of the unwanted visible signals.

3. The television vertical timebase circuit of claim 2 wherein the generating means comprise current source means arranged to charge a capacitor.

4. The television vertical timebase circuit of claim 3 wherein the means for inhibiting generation of the ramp voltage comprises means for inhibiting charging of the capacitor during the occurrence of the unwanted visible signals.

5. The television vertical timebase circuit of claim 4 wherein the current source means comprises two current sources arranged simultaneously to charge the capacitor to provide one of the two ramp voltages and wherein one current source is arranged to charge the capacitor to provide the other of the two ramp voltages.

6. The television vertical timebase circuit of claim 5 wherein the first and second picture aspect ratios are 4:3 and 16:9 respectively.

7. The television vertical timebase circuit of claim 6 wherein the predetermined portion of the second ramp voltage is that portion coinciding with the portion of the television picture which does not contain the unwanted visible signals.

8. The television vertical timebase circuit of claim 7 wherein the predetermined voltage is an offset voltage arranged to vertically offset the second television picture such that it is placed centrally on the screen.

9. The television vertical timebase circuit of claim 8 wherein the unwanted visible signals are sampling lines added to the television signal.

10. The television vertical timebase circuit of claim 9 wherein the adding means is a voltage adder circuit.

* * * * *